United States Patent [19]
Preslar et al.

[11] Patent Number: 5,900,643
[45] Date of Patent: May 4, 1999

[54] INTEGRATED CIRCUIT CHIP STRUCTURE FOR IMPROVED PACKAGING

[75] Inventors: Donald R. Preslar, Somerville; John C. Hale, Flemington, both of N.J.

[73] Assignee: Harris Corporation, Melbourne, Fla.

[21] Appl. No.: 08/858,845

[22] Filed: May 19, 1997

[51] Int. Cl.⁶ .......................... H01L 23/58; H01L 23/48; H01L 23/52

[52] U.S. Cl. .......................... 257/48; 257/780; 257/784; 257/773

[58] Field of Search .................................. 257/735, 773, 257/780, 781, 782, 784, 774, 775, 776, 48

[56] References Cited

U.S. PATENT DOCUMENTS 4,984,061  1/1991  Matsumoto ............................ 257/776

FOREIGN PATENT DOCUMENTS

| | | | |
|---|---|---|---|
| 58-103147 | 6/1983 | Japan ..................................... | 257/774 |
| 62-299052 | 12/1987 | Japan ..................................... | 257/773 |
| 1-319956 | 12/1989 | Japan ..................................... | 257/784 |
| 5-235085 | 9/1993 | Japan ..................................... | 257/784 |
| 2004417 | 3/1979 | United Kingdom ................... | 257/784 |

*Primary Examiner*—Mahshid D. Saadat
*Assistant Examiner*—Jhihan B Clark
*Attorney, Agent, or Firm*—Henry I Schanzer

[57] ABSTRACT

First and second electrical components on an integrated circuit chip are electrically connected respectively to a wire bonding pad and to a probe contacting area of a size significantly less than the bonding pad. The pad and contacting area are electrically isolated whereby both components can be separately electrically tested by test probes contacting each of the pad and the contact area. After the components have been tested, the bonding pad and the probe contact area are electrically connected together for electrically connecting the first and second components. The electrical connection is made by bonding a terminal wire to the bonding pad as well as to an extension from the contact area substantially filling a space within the bonding pad and underlying the joint formed between the terminal wire and the bonding pad.

11 Claims, 3 Drawing Sheets

INTEGRATED CIRCUIT CHIP STRUCTURE FOR IMPROVED PACKAGING

BACKGROUND OF THE INVENTION

This invention relates to semiconductor devices, and particularly to structures on semiconductor chips of integrated circuit devices for more efficient use of chip area, particularly in connection with packaging of the devices.

Many types of semiconductor integrated circuit (IC) devices comprise one or more semiconductor chips, each including numerous electronic components interconnected to one another on and within the chip. Various ones of the components are electrically connected to respective bonding pads on the chip to which terminal wires are secured for providing electrical connections between the chip components and components and circuits external to the chip.

The bonding pads may be relatively large and take up a substantial portion of the surface area of the chip. In some instances, the number of bonding pads required imposes undesirable limitations upon the design and utility of the chip.

For example, in certain power controlling applications, a relatively large transistor is provided on a chip for controlling the flow of relatively large currents to and from a device external to the chip. The path for the current is through small diameter (e.g., 2 mil. diameter) terminal wires bonded to the chip bonding pads and thence to external terminals. Owing to the large currents involved, it is necessary to employ several terminal wires in parallel. In one application, for example, six terminal wires are employed, three wires connected to the transistor source region and three wires connected to the transistor drain region. Each of the wires is connected to a respective bonding pad connected, in turn, to a respective source or drain region of the transistor by a conductive path on the chip.

Six bonding pads may thus be required for but the one transistor. Also, because the bonding pads are directly in the paths of currents to the terminal wires, they must be of adequate size to provide low resistance connection to the terminal wires. The six bonding pads thus take up a relatively large amount of space on the chip and reduce the amount of space for other electrical components.

Compounding the problem created by the relatively large number of relatively large size bonding pads required for the power transistor is that, in some instances, an extra bonding pad is required for allowing independent testing of components otherwise not requiring a separate electrical terminus.

An example of such instance is shown in FIG. 1 which shows, partially structurally and partially schematically, a portion of a known IC chip 6 disposed within a device package 8 having a number of terminal leads 10. The chip includes a power transistor T16 for controlling the current through a solenoid 12 connected to the package terminal lead 10 and thence to the transistor drain electrode 26 via terminal wires 32 bonded to bonding pads 30 on the chip. Three bonding pads 30 are shown all connected to the transistor drain electrode 26. Other bonding pads connected to the transistor source electrode 27 are not shown.

When the transistor T16 is turned-on and conducting, under control of a control circuit 18, current flows through the solenoid 12 for, e.g., closing a switch. When the transistor T16 is turnedoff, current through the solenoid 12 stops. A problem, however, is that, depending upon the speed of turn-off of the solenoid current, the energy stored in the solenoid coil generates a spike voltage which can be of sufficient amplitude to cause voltage breakdown of the transistor T16 and destruction thereof.

For protecting the transistor T16, a Zener diode 20 and a blocking diode 24 are formed on the chip and are connected in series between the drain electrode 26 and the gate electrode 22 of T16. The Zener diode is designed to break down at a Zener voltage (Vz) which is significantly less than the breakdown voltage (BV) of transistor T16. For example, Vz of Zener diode 20 may be 80 volts and BV of T16 may be 120 volts. When the spike voltage at terminal 10 reaches and/or exceeds the breakdown voltage of the Zener diode 20, the Zener diode 20 breaks down (but safely and repeatably) and, the spike voltage, decreased by Vz and the forward voltage (Vf) of diode 24, is applied to the gate electrode 22 of the just turned-off transistor T16. Transistor T16 is then again turned-on, but just long enough to dissipate the solenoid inductive current through the source-drain path of transistor T16 to ground.

During manufacture of the chip, it may be desirable to test the breakdown voltage of Zener diode 20, e.g., 80 volts, and to establish that the transistor T16 can withstand a somewhat higher voltage, e.g., 100 volts. A problem, however, is that if Zener diode 20 is directly connected, on the chip, to the drain region 26 of the transistor 16, it is not possible to apply a test voltage of 100 volts to the drain region 26 because the Zener diode 20 breaks down at the lower 80 volts preventing the determination of the breakdown voltage of T16.

A solution to the problem is, as shown in FIG. 1, to connect the Zener diode 20 to a bonding pad 31 separate from the bonding pad 30 to which the drain electrode 26 is connected. Thus, separate test probes (not shown) can be applied to each of the pads 30 and 31 for separate and/or independent testing the BV of transistor T16 and the Vz of Zener diode 20. Then, after testing, the chip 6 is mounted in a package 8 and terminal wires 32 are bonded to each bonding pad 30 and 31 and terminated on a common package terminal 34.

The arrangement shown in FIG. 1 is generally quite satisfactory except that, while only a single external connection to the solenoid 12 is required for the electrically interconnected Zener diode 20 and the drain electrode 26, a minimum of two bonding pads 30 and 31 are required on the chip.

A still further complication arises when, as previously discussed and as shown in FIG. 1, multiple bonding pads and terminal wires 32 are required for safely conducting relatively large currents to and from the transistor T16. In FIG. 1, all the terminal wires 32 from the various drain bonding pads 30 and the Zener diode bonding pad 31 are shown bonded to the same package terminal 34. A problem, however, is that because of size limitations of the terminal 34, only a limited number of terminal wires 32 can be bonded thereto, hence the need for a separate bonding pad 31 for independent testing purposes can also require the use of an extra package terminal to which the extra bonding pad 31 can be connected.

SUMMARY OF THE INVENTION

The invention resides, in part, in the recognition that an area required on a chip for electrical contacting by a test probe may be less than that required for a wire bonding pad. Thus, in contrast to the prior art structure described above, on chips embodying the invention the separate testing of two components is made possible by providing and connecting one bonding pad to one of the components, and providing and connecting a separate and smaller probe contacting "test" area electrically insulated from the bonding pad to the other of the two components. Accordingly, both components can be separately and/or independently tested. After the components have been tested, the test area and the bonding pad are electrically connected together directly on the chip, and only a single terminal wire is used for providing a common external connection for both components.

In a preferred embodiment, the probe contacting area and the bonding pad are so physically disposed that the joint formed between the terminal wire and the bonding pad overlies and contacts a portion of the probe contacting area, thereby electrically interconnecting the two areas. In one embodiment, a gap is provided between two portions of the bonding pad and a portion of the probe contact test area (or the test area itself) extends into the gap in close but spaced apart relation to the two bonding pad portions. After testing of the components, the terminal wire is connected to the test area and the bonding pad. In effect, the test area or the extension thereof forms a part of a composite bonding pad all portions of which are overlaid and electrically interconnected by the terminal wire.

For a reason described hereinafter, the composite bonding pad may be formed from two overlapping metal layers partially separated by a layer of insulating material. The insulating layer underlies the gaps between separate portions of the composite bonding pad and overlies portions of the bottom metal layer otherwise exposed through the gaps.

DESCRIPTION OF THE DRAWING

In the accompanying drawings which are schematic and not to scale, like reference characters denote like components; and.

DESCRIPTION OF A PREFERRED EMBODIMENT

Figure 2A:
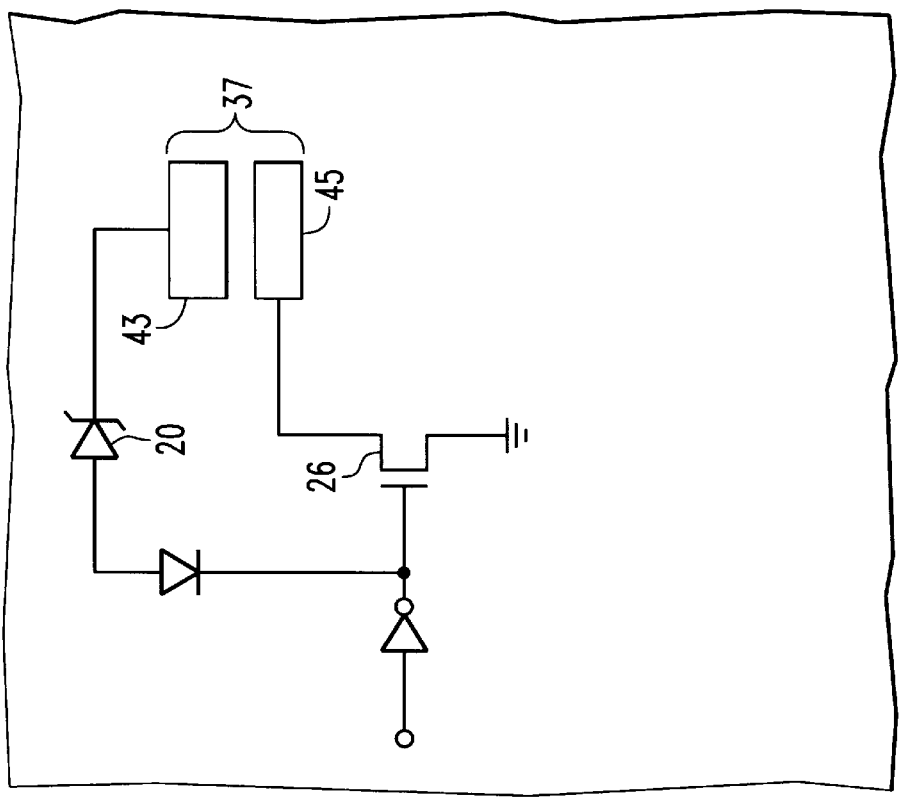
FIGS. 2A and 2B show portions of a chip, and show, respectively, first and second structures according to the present invention.
Figure 2B:
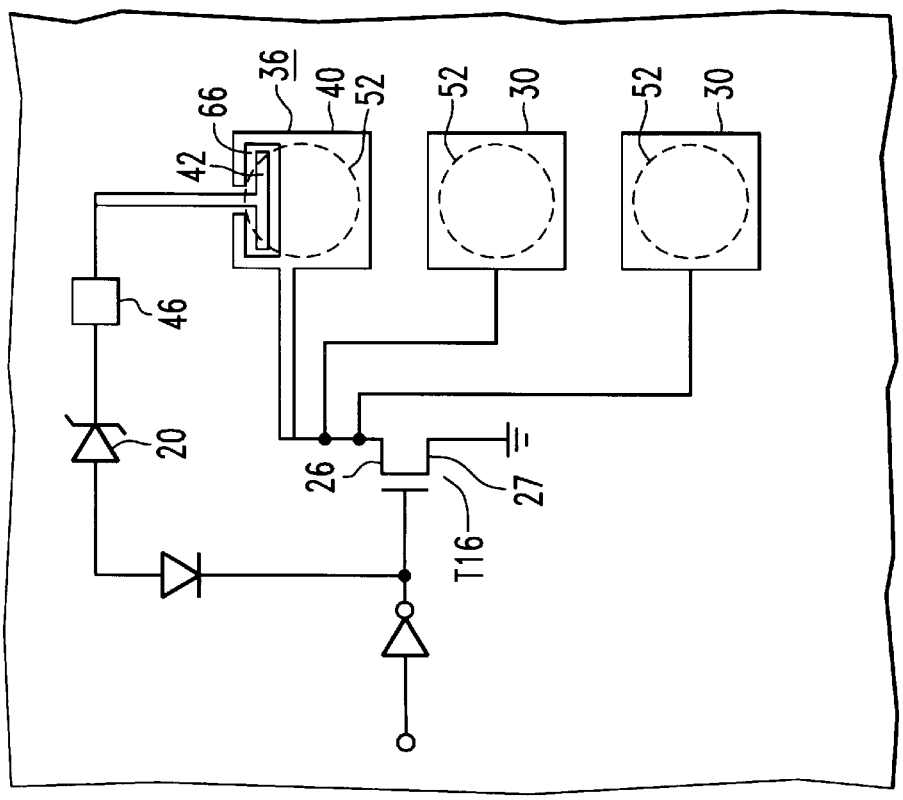

An explanation of one aspect of the invention will first be provided with reference to FIGS. 2A and 2B.

FIG. 2A shows a preferred arrangement according to the invention. In FIG. 2A, the drain electrode 26 of a transistor T16 is connected to two bonding pads 30 of known type but, in accordance with this invention, drain electrode 26 is also connected to a "composite" bonding pad 36 including two spaced apart portions, namely, a large portion 40 connected to the drain electrode 26, and a smaller portion 42 substantially enclosed by the portion 40 but electrically separated therefrom by a small gap 66. The small portion 42 is electrically connected to a "test" pad 46 connected, in turn, to the Zener diode 20.

Because the composite pad portions 40 and 42 are electrically insulated from each other, separate electrical testing of the diode 20 and the transistor T16 is possible by means of separate test probes (not shown) which are respectively brought into contact with the bonding pad large portion 40 and the test pad 46.

After testing, the chip is mounted in a package, not shown, and terminal wires are bonded to each of the bonding pads 30 and 36, but not to the test pad 46. The bonding wire (shown by a dash circle 52 in FIG. 2) overlaps and contacts both portions 40 and 42 of the composite bonding pad 36, hence electrically interconnects the two portions (hence the Zener diode 20 and the drain electrode 26) directly on the chip and without the use of an extra fourth terminal wire or extra bonding pad 30 as in the prior art FIG. 1. Because, as above-noted and discussed further hereinafter, a test probe can require far less contacting area than a bonding pad, the test pad 46 can be far smaller than a typical bonding pad and can be disposed on quite small otherwise unused portions of the chip surface.

The invention illustrated in FIG. 2A solves the particular problems faced by Applicants. However, the inventive concept may also be used in other situations.

Figure 1:
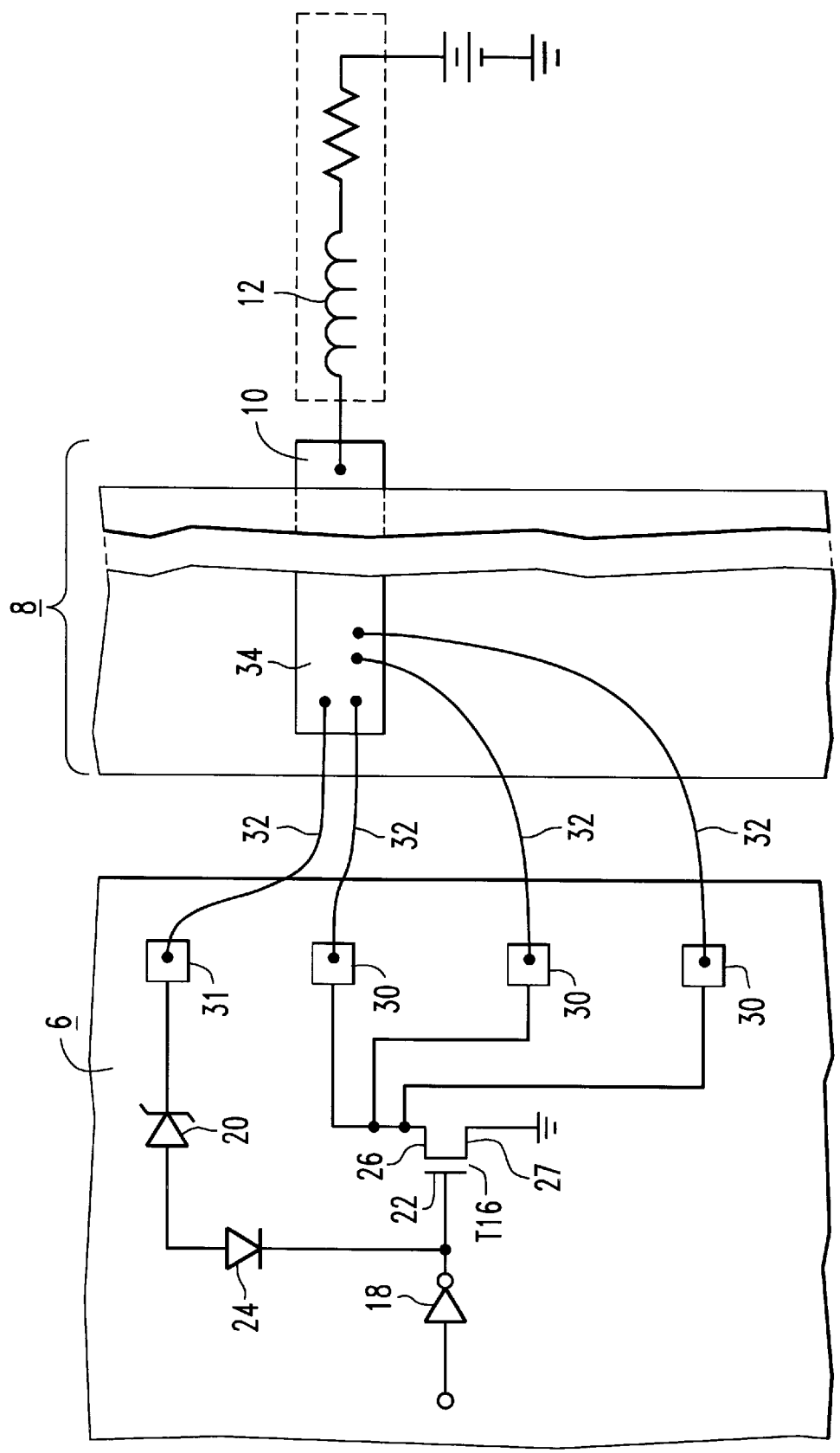
FIG. 1 is a view of a prior art arrangement for electrically interconnecting two components on a chip to a terminal external to the chip.

In the power transistor application described in connection with FIG. 1, a major problem is providing low resistance paths for currents from the chip transistor T16 to the terminal wires 32. This requires, as previously noted, that the bonding pads be of a size at least comparable to the joint between the terminal wire and the bonding pad. In the solution shown in FIG. 2A, owing to the relatively large size of the drain connected portion 40 of the bonding pad 36 compared to the Zener diode connected portion 42, as well as the fact that the large portion 40 substantially surrounds the small portion 42 (for thus contacting substantially the entire peripheral area of the wire to pad joint), the necessary low resistance wire to drain connected bonding pad condition is achieved.

However, in situations where only small power electrical signals are involved, the arrangement shown in FIG. 2B can be used.

In FIG. 2B, for example, a separate test pad for the Zener diode 20 is not used but, rather, the Zener diode 20 (i.e., or some similar "second" component) is connected directly to a portion 43 of a composite bonding pad 37 comprising two portions 43 and 45 which may be of equal or different size. The bonding pad portion 45 is connected to the drain electrode 26 (i.e., or some similar "first" component). The two portions 43 and 45 are each large enough for use as a probe contacting site and, after testing of the (first and second) components, can be interconnected by means of a terminal wire overlapping and contacting both portions 43 and 45. However, heavy current carrying capability is not fully accomplished in the FIG. 2B arrangement owing to the use of only the bonding pad half portion 45 for connecting the transistor drain region to the terminal wire.

A more detailed explanation of a preferred embodiment of the invention is now provided.

Figure 3:
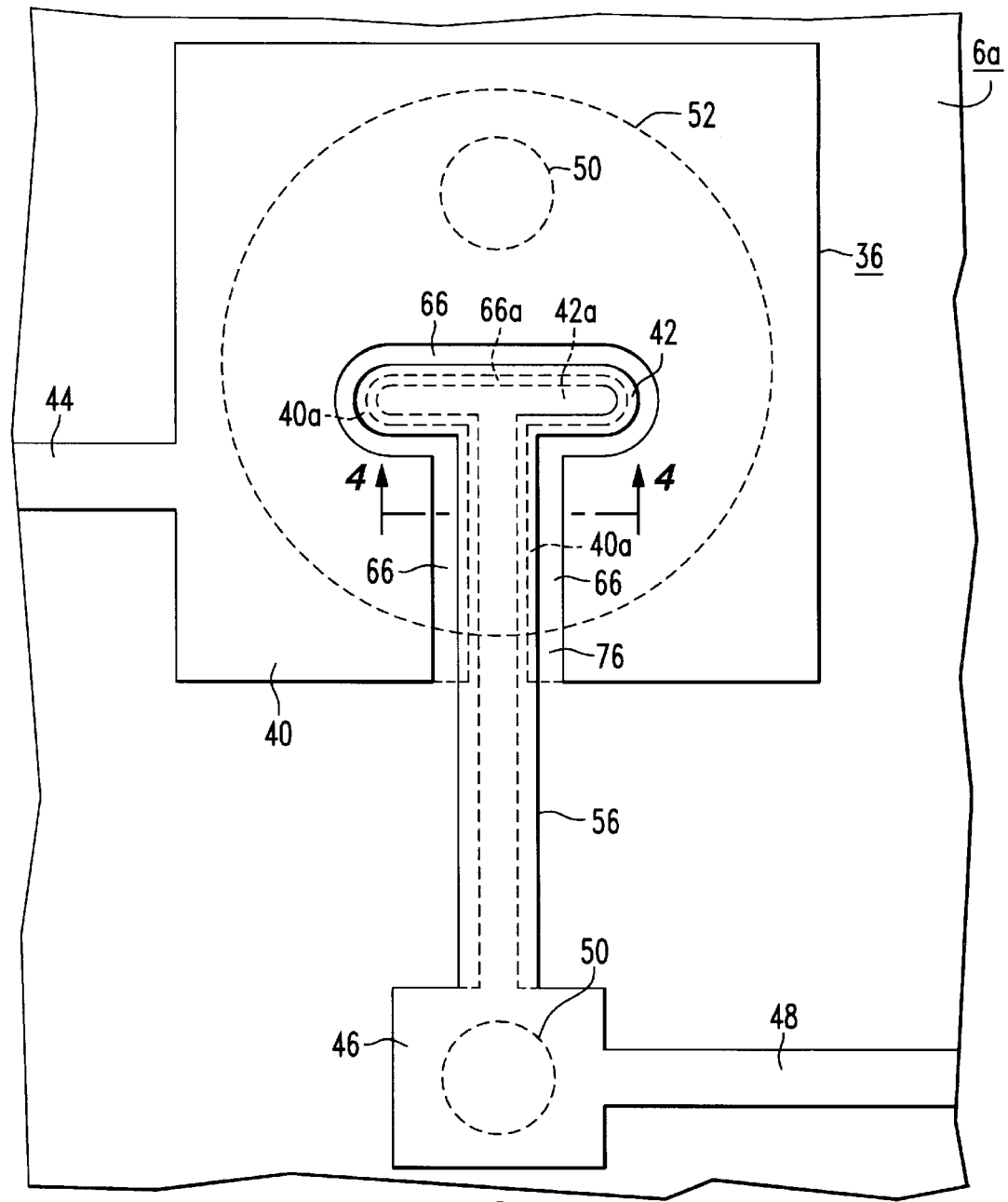
FIG. 3 is a plan view of a portion of an integrated circuit semiconductor chip including structure such as shown in FIG. 2A.
Figure 4:
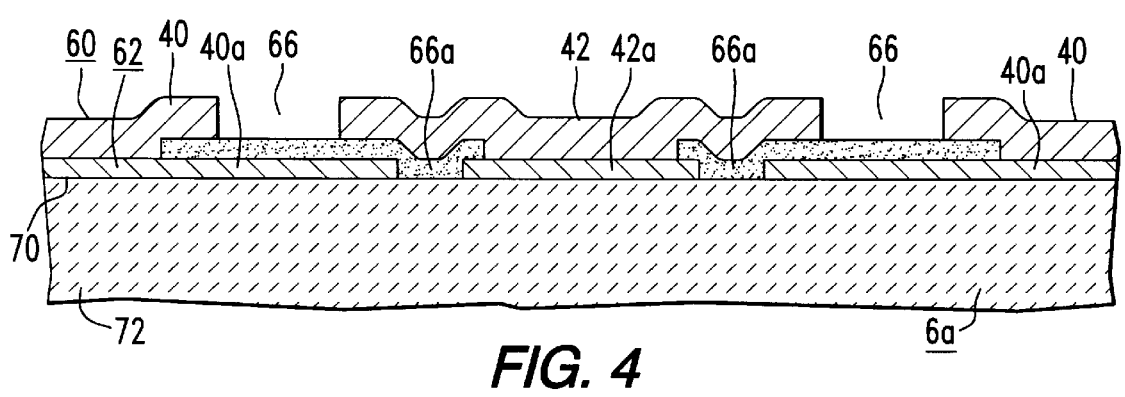
FIG. 4 is a cross-sectional view taken along line 4—4 of FIG. 3.

FIGS. 3 and 4 show a small portion of an integrated circuit (IC) semiconductor chip 6a on which structure according to the present invention is disposed. Depending upon the electrical function of the chip, the structure shown in FIGS. 3 and 4 can be replicated along other portions of the chip. Other details of the chip, e.g., various electronic components and devices and circuits made therefrom, can be in accordance with known semiconductor IC technology. Also, while the fabrication of the structure shown in FIGS. 3 and 4 is hereinafter described, any known processing technologies and materials can be used.

Included in the structure shown in FIGS. 3 and 4 is a composite bonding pad 36 such as the pad 36 shown in FIG. 2A. The pad 36 is identical in function to known bonding pads in that it serves as a site or landing to which a known terminal wire can be firmly bonded using known bonding techniques, e.g., thermal compression or ultrasonic bonding.

However, the pad 36 differs from known bonding pads in that it includes two spaced apart and electrically separate portions 40 and 42. The portion 40 is connected by a conductive path 44 to a "first" component on the chip 6a such as, for example, the transistor T16 shown in FIG. 2A. The composite pad 36 is of a size comparable to prior art bonding pads for the bonding of a terminal wire thereto. Also disposed on the chip portion is a "test pad" 46 somewhat smaller than the composite bonding pad 36 and electrically connected via a path 48 to a "second" component (e.g., the Zener diode 20 shown in FIG. 1). The portion 42 of the composite bonding pad 36 is electrically connected to the test pad 46 (via a conduction path 56) but not, as above noted, to the portion 40 of the pad 36.

Because the test pad 46 is electrically insulated from the portion 40 of the bonding pad 36, each of the two components connected to the bonding pad 40 and to the test pad 46 can be electrically tested, independently of each other, by means of one or more test probes. Of significance, the amount of space required for contacting a known needle-like, tapered test probe (e.g., having a diameter at a contacting end of the probe of around 1.0 milli-inch) is significantly less than the area required for the bonding of a typical 2.0 milli-inch diameter terminal wire (such as the wires 32 shown in FIG. 1). This size difference is indicated in FIG. 3 by the use of dashed line circles 50 showing the equal size areas on the two pads 40 and 46 contacted by test probes during a testing procedure, and a dashed line circle 52 showing the area of the composite bonding pad 36 to be contacted by a terminal wire after testing of the components. (Typically, the joint made by a bonded wire is larger than the diameter of the wire owing to bonding pressure expansion of the wire end. For example, a 2 milli-inch diameter wire can form a 4 milli-inch diameter joint. The bonding pads are at least comparable in size and preferably somewhat larger, e.g., to 8 milli-inch sided square pads.)

As shown in FIG. 3, the pad 46 can be of a size significantly less than that of the composite bonding pad 36 since a terminal wire need not be bonded to the test pad 46. In contrast to the prior art arrangement shown in FIG. 1, in IC's made in accordance with the invention, the total area taken up by the composite bonding pad 36 and the test pad 46 is significantly less than the area taken up by two bonding pads (e.g., 30 and 31 in FIG. 1) each of a size equal to the composite bonding pad 36 shown in FIG. 3.

After testing, the chip 6a is then, for example, disposed within an IC package and, in accordance with standard practice, terminal wires are bonded to bonding pads on the chip. A terminal wire is also bonded to the composite bonding pad 36 shown in FIGS. 3 and 4. As indicated in FIG. 3 by the dash line circle 52, the bonded terminal wire overlaps and contacts both portions 40 and 42 of the composite bonding pad 36. Accordingly, upon the bonding of a single terminal wire to the composite bonding pad 36, the first and second components respectively connected to the test pad 46 and to the portion 40 of the bonding pad 36 are electrically connected together directly on the chip.

FIG. 4 illustrates that the composite bonding pad 36 is preferably formed from two layers of metal.

Typical semiconductor chips, e.g., of silicon, contain various doped regions within the chip, and stacks of layers of various materials overlying a surface of the chip. Basically, the chip surface is hermetically encased by one or more sealing layers, and various paths of metal are disposed on surfaces of the sealing layers. The metal paths hermetically pass through the sealing layers for contacting spaced apart areas of the chip surface overlying respective doped regions.

Typical bonding pads comprise enlarged areas of metal (such as the areas 30 shown in FIG. 1) at the ends of respective metal paths overlying one or more chip sealing layers. After the bonding pads have been formed, the entire surface of the chip workpiece is completely overcoated with a relatively thick and relatively impervious passivation layer. The chip has yet to be probed in a final test, and the chip is eventually to be mounted within a package at which time terminal wires are to be bonded to the bonding pads. To these ends, windows are provided through the passivation layer exposing portions of the bonding pads. The passivation layer windows are defined by corresponding windows through an etchant mask provided over the passivation layer for exposing those portions of the passivation layer which are to be etched away. Importantly, the etchant mask windows do not overlie edges of the bonding pads for preventing exposure of the bonding pad edges by the etched windows. The reason for this is that the metal of the bonding pads is resistant to the etching process used, hence, when the windows being etched through the passivation layer reach the bonding pads, thus exposing them as desired, the process automatically stops. Conversely, if the etched windows overlapped beyond the edges of the metal pads, the etching would continue through the sealing layers on which the bonding pads are disposed. This could destroy the hermetic sealing of the chip surface.

Turning now to the composite bonding pad 36 shown in FIG. 3, a gap 66 is deliberately provided between the two portions 40 and 42 to maintain these two portions electrically isolated from each other until connected together by an overlapping terminal wire. If the entire pad 36 were formed simply of spaced apart portions of a single layer of metal (such single layers being used in typical bonding pads), and if such single layer overlaid a sealing layer of the chip, that portion of the sealing layer exposed through the gap between the two pad portions 40 and 42 would be exposed to the passivation layer etching process. Thus, the sealing layer underlying the gap 66 could be damaged.

This is avoided according to the present invention by forming the two portions 40 and 42 of the composite bonding pad 36 substantially identically in each of two overlapped metal layers 60 and 62 (FIG. 4). As shown in FIG. 4, the gap 66 between the two portions 40 and 42 in the top metal layer 60 is off-set from a gap 66a between two portions 40a and 42a in the lower layer 62. The result of this is that the gap 66 in the upper metal layer 60 overlies not a chip sealing layer, but a continuous portion of the lower metal layer 62 which then serves as a protective mask against the passivation layer etching process.

The two metal layer configuration of the composite bonding pad is evident from FIG. 4. In the process of fabricating the structure shown in FIGS. 3 and 4, a first (lower) layer 62 of metal is deposited on a surface 70 of chip sealing layer 72, e.g., of silicon dioxide. The first metal layer 62 is then patterned to provide a structure substantially as shown in FIG. 3 but of the lower metal layer 62 only. (FIG. 3 shows the structure provided by the upper metal layer 60 in solid lines. The portion of the bonding pad 36 provided by the lower metal layer 62 is shown in dash lines.) Thus, the test pad 46 is formed, including the extending paths 48 and 56, as well as the portion 42a at the end of the path 56. Also formed from the first metal layer 62 is the portion 40a surrounding the portion 42a but separated therefrom by a gap 66a.

Then, a thin layer 76 of insulating material, e.g., silicon dioxide, is deposited over the chip workpiece and patterned as shown in FIG. 4 and as partly shown in FIG. 3. The patterned layer 76 completely overcoats the gap 66a between the two portions 40a and 42a formed from the lower metal layer 62, and overcoats some but not all the upper surfaces of the portions 40a and 42a formed from the lower metal layer. The insulating layer 76 is only partially visible in FIG. 3 but is present only in that part of the pad 36 adjoining the gap 66.

Then, the second layer 60 of metal is deposited on the chip workpiece and patterned to the shape shown in FIGS. 3 and 4.

The two pad portions 40 and 42 are present in the upper metal layer 60 and separated by the gap 66. The gap 66, however, is offset from and does not overlie the gap 66a present in the first layer 62. Additionally, as shown, the gap 66 overlies a portion of the insulating layer 76. This is important for preventing etching through the lower layer 62 when the upper layer 60 is etched to provide the gap 66 separating the two portions 40 and 42.

With the chip portion in the condition shown in FIGS. 3 and 4, the entire chip workpiece is covered with a passivation layer previously described, and windows are etched through the passivation layer to expose the composite bonding pad 36 as well as the test pad 46. Because both the use of and the patterning of passivation layers are known, such passivation layer is not illustrated of significance, as previously explained, is that the etching of the passivation layer is self-terminating when the windows being etched reach the metal layer of the test pad 46 and the bonding pad 36. While the portion of the insulating layer 76 directly underlying the gap 66 between the portions 40 and 42 of the upper metal layer 60 will likely be etched away during the passivation layer etching step, the metal layer portion 62 underlying the gap 66 terminates the etching process and protects the underlying sealing layer 72.

In FIG. 4, the upper metal layer 60, from which the two portions 40 and 42 are formed, appears somewhat vertically uneven. However, the vertical scale is grossly exaggerated and, in fact, the upper surface of the composite bonding pad 36 is quite flat for proper contacting by and the bonding thereto of a terminal wire. Also, the gap 66 is preferably so small (e.g., 6 microns in width) that the pad 36 upper surface appears as a substantially continuous metal surface to the terminal wire for a quite solid and reliable bond between the terminal wire and the pad 36.

As shown in FIG. 3, the portion 42 of the pad connected to the test pad 46 is of T shape. The horizontal bar increases the area of the portion 42 for contact by the terminal wire while not reducing the size of the upper portion 40 above the portion 42 for contacting by a test probe (the circle 50).

What is claimed is:

1. A structure for selectively connecting first and second components formed on a semiconductor chip comprising:
    a bonding pad formed on the chip electrically connected to said first component;
    a contact area formed on the chip of a size smaller than said bonding pad, said contact area electrically connected to said second component; said contact area being separate and insulated from said bonding pad whereby each one of said components can be independently tested;
    said contact area having a portion disposed in close proximity to said bonding pad for enabling a bond wire to be placed so as to overlap onto both said contact area and said bonding pad for electrically interconnecting said contact area and said bonding pad; and
    wherein said bonding pad surrounds a significant portion of said contact area.

2. A structure as claimed in claim 1 wherein said first component is a power transistor having a gate electrode and source and drain electrodes defining the ends of a conduction path, and wherein the drain electrode of said power transistor is connected to said bonding pad; and
    wherein said second component includes a Zener diode and wherein the second component is connected between the contact area and the gate electrode of the power transistor.

3. A semiconductor chip including first and second electrical components electrically isolated from one another on the chip for independent electrical testing of said components, and a bonding pad for selectively electrically interconnecting said components, said bonding pad comprising first and second portions electrically isolated from one another and respectively electrically interconnected to said first and second components, and said portions being adjacent one another for the overlapping bonding of a terminal wire to both said portions for electrically interconnecting said two portions; and
    wherein said first portion of said bonding pad is larger than said second portion for contacting a major portion of a joint formed between a terminal wire and said bonding pad, and said first component conducts therethrough, via said first portion of said bonding pad, an electrical current larger than that conducted through said component via said second portion of said bonding pad.

4. A chip according to claim 3 wherein said bonding pad first portion substantially completely encloses said bonding pad second portion.

5. A chip according to claim 4 wherein said bonding pad first portion includes a first continuous surface area of a size for direct contacting by a probe for electrical testing of said first component, and said bonding pad second portion is electrically connected to a test pad comparable in area to said first continuous surface area of said first portion.

6. A chip according to claim 3 wherein said bonding pad comprises a first layer of metal segmented by a first gap for providing said bonding pad first and second portions, said gap overlying a second layer of metal electrically isolated from one of said two portions.

7. A chip according to claim 6 wherein said gap is defined by facing edges of said bonding pad first and second portions, said second metal layer underlies said facing edges, and including a layer of insulating material disposed between second metal and said facing edges.

8. A chip according to claim 7 wherein said second metal layer is segmented by a second gap into third and fourth portions, each underlying and electrically connected to said first and second portions, respectively, and said second gap is laterally spaced apart from said first gap.

9. A semiconductor chip including a first component electrically connected to a plurality of bonding pads and a plurality of terminal wires connected to respective bonding pads for conducting electrical current to said first component, some of said bonding pads consisting of a continuous area of metal for bonding to a terminal wire connected thereto, and one of said bonding pads including an area of metal segmented into isolated first and second portions with a terminal wire connected to said first and second portions so as to overlap both said first and second portions and connecting them electrically and wherein said first electrical component is electrically connected, in the absence of said terminal wire, to only said first portion of said bonding pad, said second portion thereof is electrically connected to a second component electrically isolated, in the absence of said terminal wire, to said bonding pad second portion; and wherein one of said first and second bonding pads is larger in size than the other and surrounds a significant portion of the other bonding pad.

10. A semiconductor integrated circuit chip having first and second electrical circuit components, each component having at least first and second electrodes;

means connecting the first electrode of the first and second components to a first node;

means connecting the second electrode of the first component to a bonding pad; means connecting the second electrode of the second component to a test pad, said test pad being electrically isolated from said bond pad for enabling the second component to be tested independently of said first component, said test pad being smaller than said bonding pad but in close proximity therewith; and said bond pad surrounding at least a portion of said test pad and defining a space therebetween for enabling a wire connection to contact the test pad and the bond pad by filling the space therebetween.

11. A semiconductor device comprising a terminal lead and a semiconductor chip electrically connected to said terminal lead by means of a terminal wire, said terminal wire being bonded to said chip and providing an electrical interconnection between otherwise separately and electrically insulated first and second bonding pad portions to which are respectively connected first and second components on said chip;

wherein said terminal wire is bonded by means of a joint spanning and electrically interconnecting said two otherwise electrically insulated bonding pad portions, each of said portions being electrically connected to a respective one of said components; and wherein a first of said bonding pad portion is larger than and substantially encompasses the second of said bonding pads.

* * * * *